(12) United States Patent
Lee

(10) Patent No.: US 7,704,829 B2
(45) Date of Patent: Apr. 27, 2010

(54) METHOD FOR FABRICATING NONVOLATILE MEMORY DEVICE

(75) Inventor: Sang Bum Lee, Incheon (KR)

(73) Assignee: LG Electronics Inc., Seoul (KR)

( * ) Notice: Subject to any disclaimer, the term of this patent is extended or adjusted under 35 U.S.C. 154(b) by 522 days.

(21) Appl. No.: 11/320,906

(22) Filed: Dec. 30, 2005

(65) Prior Publication Data

US 2007/0052000 A1   Mar. 8, 2007

(30) Foreign Application Priority Data

Sep. 5, 2005   (KR) ..................... 10-2005-0082240

(51) Int. Cl.
*H01L 21/336* (2006.01)

(52) U.S. Cl. .................. 438/257; 438/258; 438/259; 438/260; 438/261; 438/262; 438/263; 438/264; 438/265; 438/266; 438/267; 438/304

(58) Field of Classification Search ......... 438/257–267, 438/304
See application file for complete search history.

(56) References Cited

U.S. PATENT DOCUMENTS

| 7,061,043 | B2 * | 6/2006 | Owa ......................... 257/316 |
| 2005/0029574 | A1 * | 2/2005 | Jeon et al. ................... 257/314 |

* cited by examiner

*Primary Examiner*—Lynne A Gurley
*Assistant Examiner*—Samuel A Gebremariam
(74) *Attorney, Agent, or Firm*—McKenna Long & Aldridge LLP

(57) ABSTRACT

A nonvolatile memory device and method for fabricating the same are provided. The nonvolatile memory device includes an active region; a source region formed in the active region; a source line formed on the source region and electrically connected with the source region, to cross over the active region; word lines aligned at each sidewall of the source line to cross over the active region in parallel with the source line; and a charge storage layer interposed between the word lines and the active region. Since the word lines are formed at both sides of the source line using an anisotropic etch-back process, without photolithography, the area of a unit cell can be reduced.

5 Claims, 5 Drawing Sheets

SECTION II-II'

SECTION III-III'

SECTION I-I'

SECTION II-II'

SECTION III-III'

SECTION IV-IV'

SECTION V–V'

METHOD FOR FABRICATING NONVOLATILE MEMORY DEVICE

This application claims the benefit of Korean Patent Application No. 10-2005-0082240, filed on Sep. 5, 2005, which is hereby incorporated by reference for all purposes as if fully set forth herein.

BACKGROUND OF THE INVENTION

1. Field of the Invention

The present invention relates to semiconductor devices, and more particularly, to a nonvolatile memory device and a method for fabricating the same.

2. Discussion of the Related Art

A nonvolatile memory device may be a floating gate type device or a charge trap type device. A floating gate nonvolatile memory device is an example of a flash memory device while a charge trap nonvolatile memory device is an example of a silicon-oxide-nitride-oxide-silicon, or SONOS, memory device. The charge-trap device has a MOS transistor structure in which a multilevel charge storage layer is used as a gate insulating layer. The charge-trap device is thereby enabled to have writing and erasing voltages lower than those of the floating-gate device. Therefore, the charge-trap device can be operated at lower power, with a smaller area for a peripheral circuit, e.g., a voltage pump. The charge-trap device can also be operated with higher reliability due to its use of a spatially isolated insulating layer for storing charges.

FIGS. 1A and 1B illustrate a related art nonvolatile memory device having a multilevel charge storage layer.

Referring to FIGS. 1A and 1B, a device isolation film 12 is formed in a semiconductor substrate 10 to define a plurality of parallel active regions. Word lines 16 are formed above the active regions by interposing a charge storage layer 14. The word lines 16 pass above the device isolation film 12, that is, above the surface of the semiconductor substrate 10, to cross over the active regions. Source/drain regions 18s and 18d are respectively formed in the active regions at both sides of the word lines 16. The source region 18s is formed between two adjacent word lines 16. Each source region 18s is connected with another source regions 18s of other active regions where there is no formation of the device isolation film 12. Common source lines, to which a plurality of source regions are connected, are formed between and in parallel with the word lines 16. By contrast, each drain region 18d is isolated between formations of the device isolation film 12, such that the formation of each drain region is restricted to an active region. A sidewall insulating film 20 forms spacers at sidewalls of the word lines 16.

The word lines may be patterned by a photolithographic process, and after their formation, the common source lines are formed by etching the device isolation film using the word lines as an etching mask. Then, impurity ions are implanted. Therefore, any desired reduction in the width of each word line and each source line is inherently limited. The limitations restrict attempts to increase the integration of a nonvolatile memory device by reducing the unit cell size.

SUMMARY OF THE INVENTION

Accordingly, the present invention is directed to nonvolatile memory device and method for fabricating the same that substantially obviates one or more problems due to limitations and disadvantages of the related art.

An advantage of the present invention is to provide a nonvolatile memory device and a method for fabricating the same, in which an area occupied by word lines and source regions is minimized to reduce the size of a memory cell.

Additional features and advantages of the invention will be set forth in the description which follows, and will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, a nonvolatile memory device includes an active region formed in a semiconductor substrate, a source region formed in the active region, a source line formed on the source region and electrically connected with the source region, to cross over the active region, word lines aligned at each sidewall of the source line to cross over the active region in parallel with the source line, and a charge storage layer interposed between the word lines and the active region.

According to another aspect of the present invention, a method for fabricating a nonvolatile memory device includes forming a source region in an active region of a semiconductor substrate, forming a source line electrically connected with the source region to cross the active region, forming spacers at sidewalls of the source line, conformally forming a charge storage layer on the active region, the spacers, and the source line, forming word lines on the charge storage layer on the active region, the word lines being aligned with the spacers to cross the active region; and forming a drain region in the active region adjacent the word lines and spaced apart from the source region.

It is to be understood that both the foregoing general description and the following detailed description are exemplary and explanatory and are intended to provide further explanation of the invention as claimed. dr

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principle of the invention. In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or similar parts.

Figure 1A:
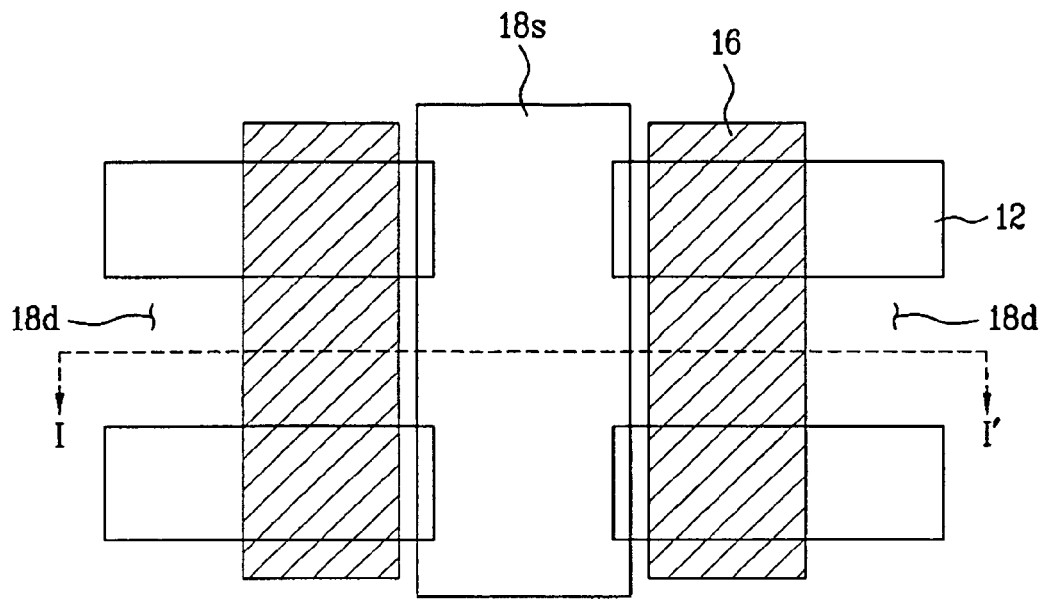
FIG. 1A is a plan view of a related art nonvolatile memory device.
Figure 1B:
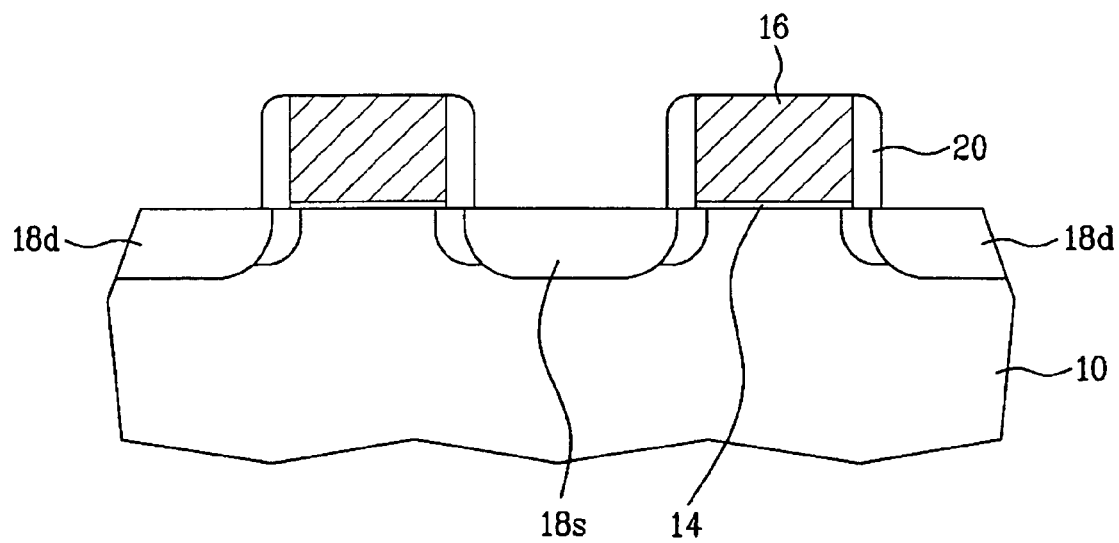
FIG. 1B is a sectional view along line I-I' of FIG. 1A.
Figure 2A:
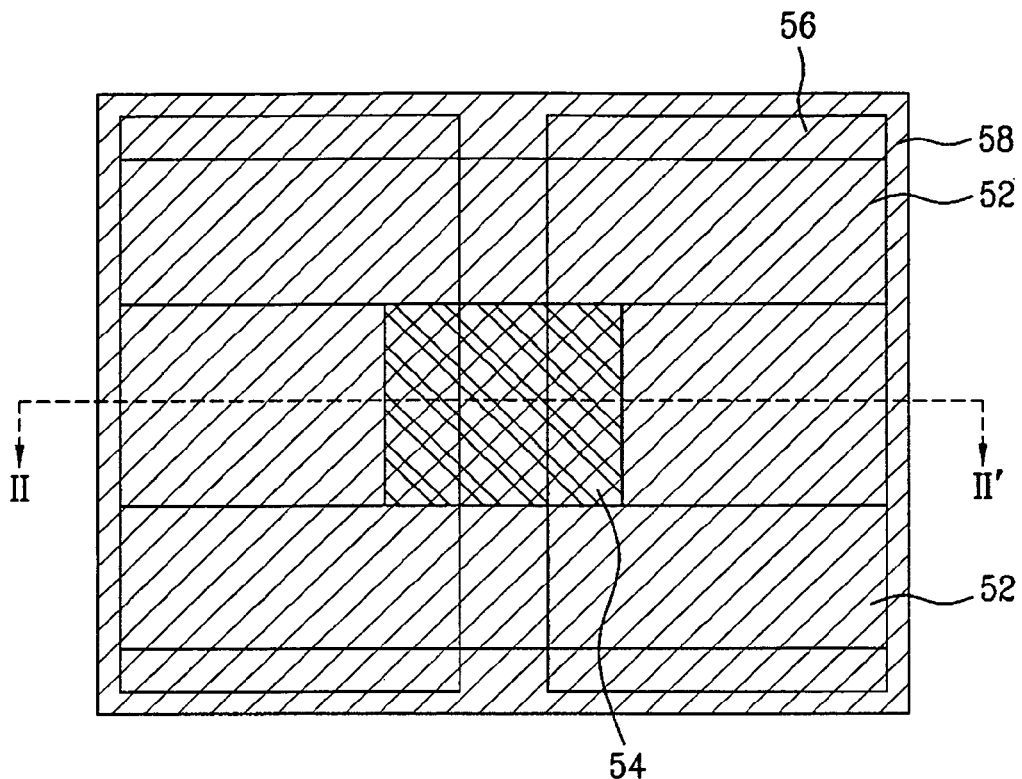
FIG. 2A is a plan view of a nonvolatile memory device according to the present invention.
Figure 2B:
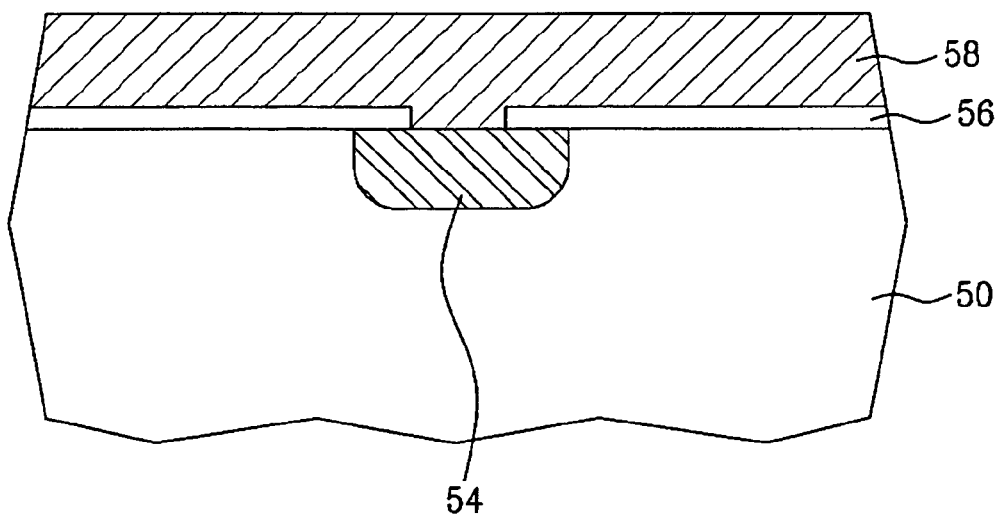
FIG. 2B is a sectional view along line II-II' of FIG. 2A.

Referring to FIGS. 2A and 2B, a device isolation film 52 is formed in a semiconductor substrate 50 to define a plurality of parallel active regions in each of which a source region 54 is formed by impurity ion implantation. An insulating film 56, having an opening that partially exposes the source region 54, is formed on the substrate surface. The insulating film 56 may be formed after formation of the source region. Once the insulating film 56 is formed, impurity ions are implanted through the opening into the source region 54. The ions are diffused by a thermal treatment process. A conductive film 58 is then formed on the substrate and is electrically connected with the source region 54 through the opening of the insulating film 56.

Figure 3A:
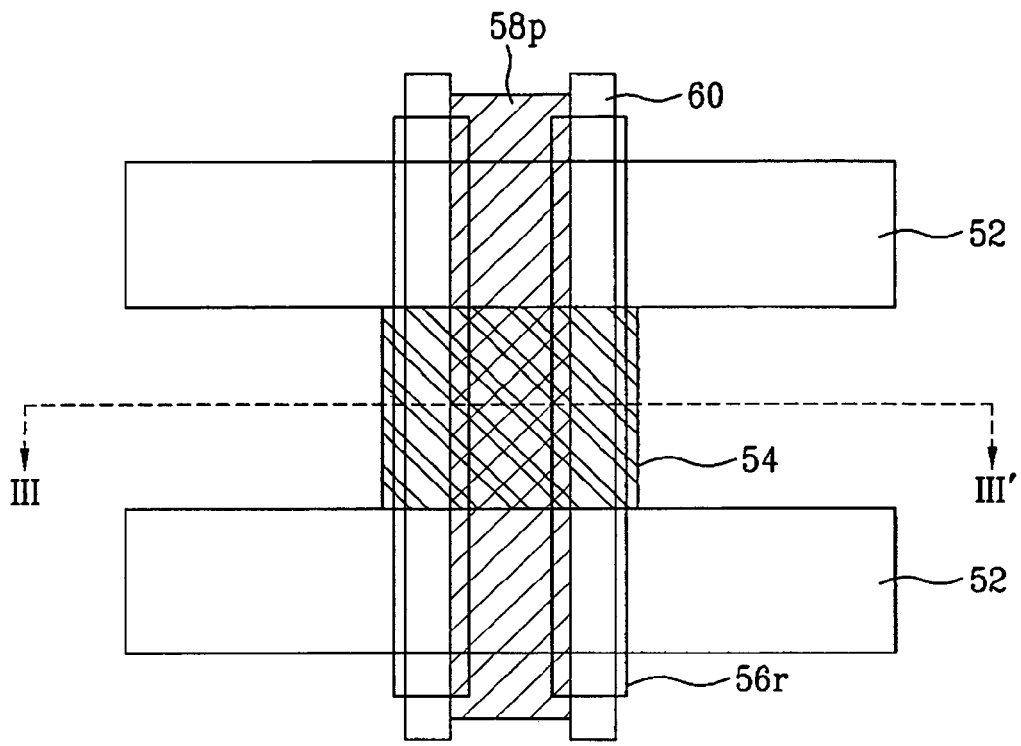
FIG. 3A is a plan view of a nonvolatile memory device according to the present invention.
Figure 3B:
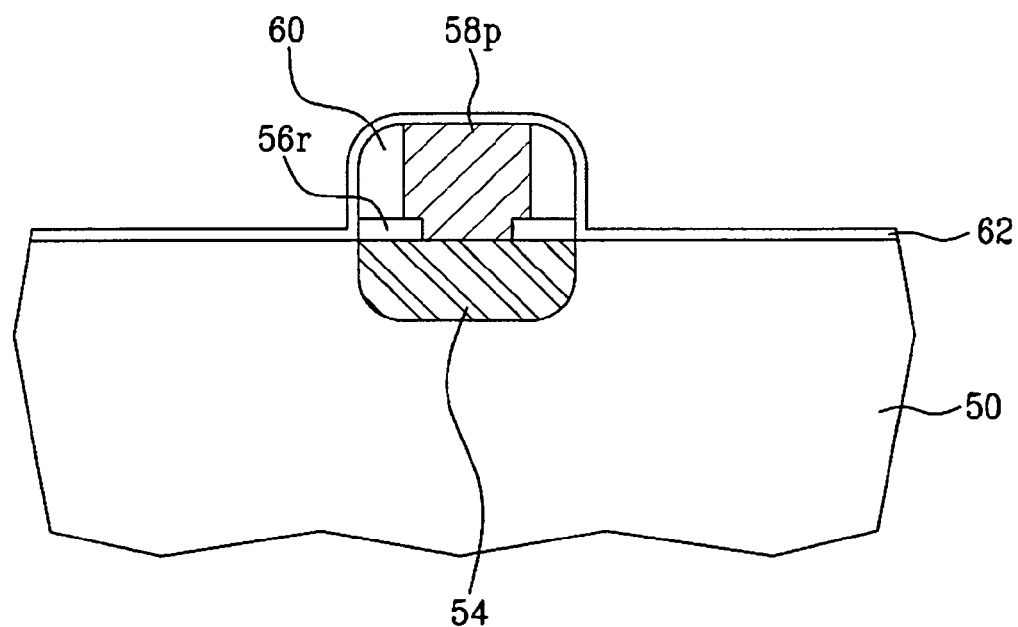
FIG. 3B is a sectional view along line III-III' of FIG. 3A.

Referring to FIGS. 3A and 3B, the conductive film 58 is patterned to form a source line 58p crossing over the active regions. Spacers 60 are formed on the sidewalls of the source line 58p, to be disposed over the source region 54 and to increase the width of the source line 58p. Spacer formation is achieved by, for example, anisotropically etching a conformal insulating film formed on the entire surface of the substrate until the upper surface of the source line 58p is exposed. The portion of the insulating film 56 left exposed after spacer formation is removed from the substrate to expose the active regions. Thereby, a patterned insulating film 56r that remains below the spacers 60 and an edge portion of the source line 58p is formed. A charge storage layer 62, made of a high-trap-density insulating film interposed between a tunnel insulating film and a blocking insulating film, is conformally formed on the entire surface of the substrate. The above structure of the charge storage layer 62 may be formed by sequentially depositing a silicon oxide film, a silicon nitride film, and a silicon oxide film.

Figure 4A:
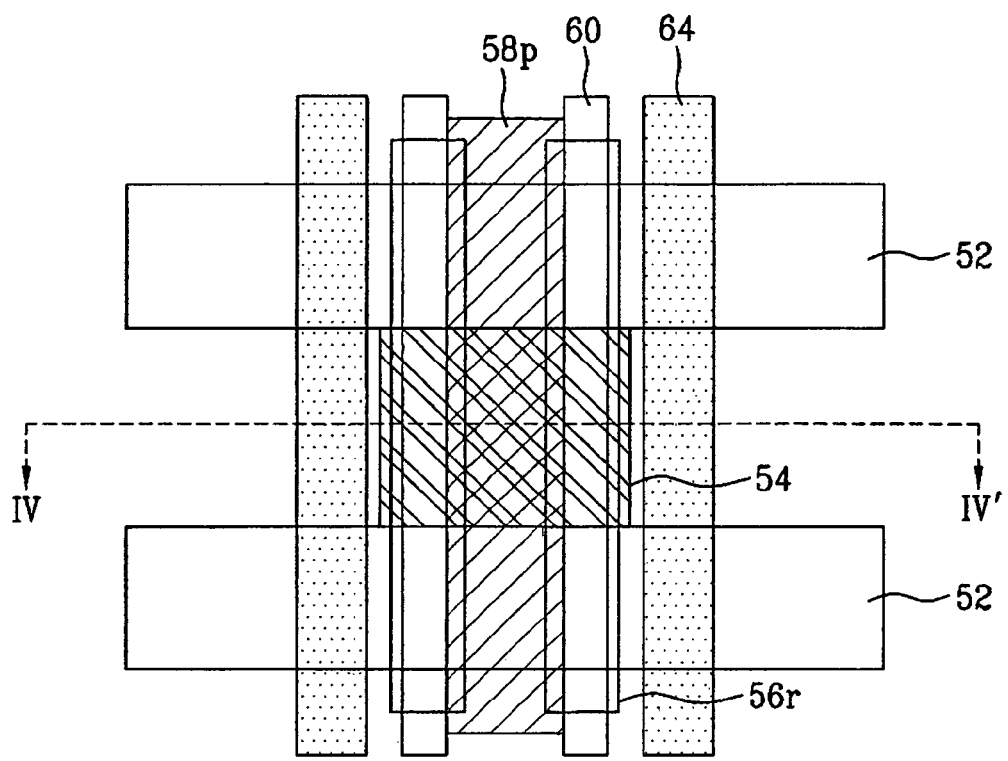
FIG. 4A is a plan view of a nonvolatile memory device according to the present invention.
Figure 4B:
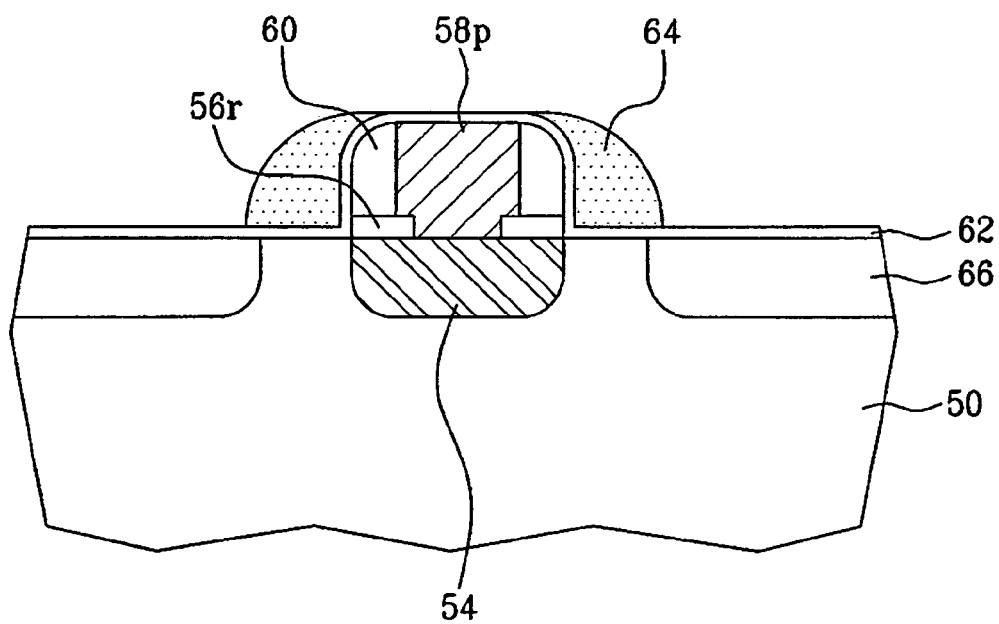
FIG. 4B is a sectional view along line IV-IV' of FIG. 4A

Referring to FIGS. 4A and 4B, a conductive film is conformally formed on the charge storage layer 62 and then etched back to form word lines 64 beyond the outer sidewalls of the spacers 60 on which the charge storage layer 62 is formed. Since the word lines 64 are formed by etch-back of the conformal conductive film, the word lines are self-aligned with respect to the spacers 60 and have a spacer-like shape, which is symmetrically arranged at both sides of the source line 58p. Using the resulting structure, including the word lines 64 of the spacer-like configuration, as an ion-implantation mask, a drain region 66 is formed to be aligned with the word lines 64 by implanting impurity ions into the substrate. As a result, the word lines 64 are arranged on the substrate, between the source region 54 and the drain region 66, and cross over the active regions in parallel with the source line 58p.

Figure 5A:
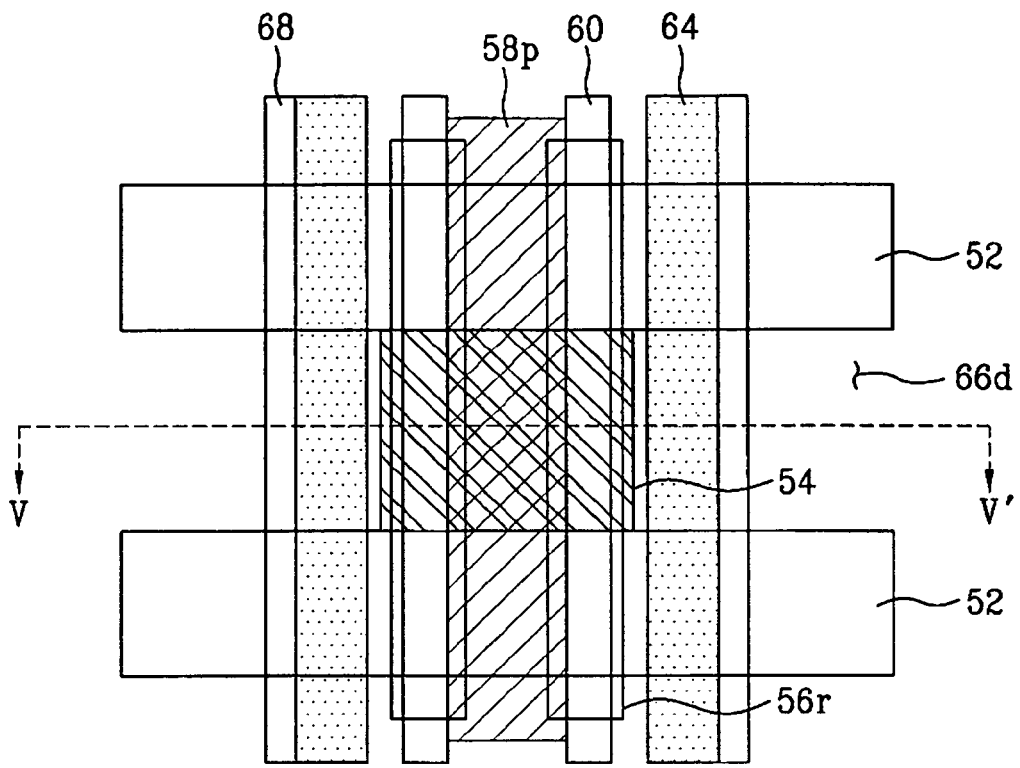
FIG. 5A is a plan view of a nonvolatile memory device according to the present invention.
Figure 5B:
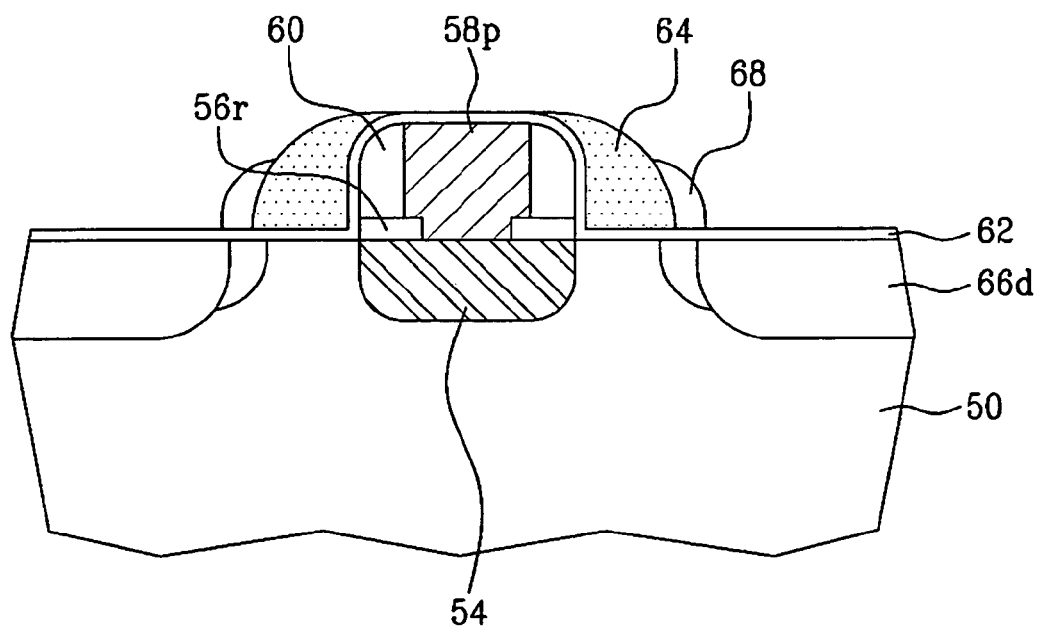
FIG. 5B is a sectional view along line V-V' of FIG. 5A.

Referring to FIGS. 5A and 5B, a spacer insulating film is conformally formed on the entire surface of the substrate on which the word lines 64 are formed and is etched back, by anisotropic etching, to form gate spacers 68 on the word line sidewalls. Using the resulting structure, including the gate spacers 68, as an ion-implantation mask, a drain region 66d is formed by implanting impurity ions into the substrate, to impart a lightly doped drain structure or a double-diffused drain structure.

Accordingly, the nonvolatile memory device according to the present invention is shown in FIGS. 5A and 5B. Here, active regions are defined in the semiconductor substrate 50 by the formation of the device isolation film 52, and the source region 54 is formed in each active region. The source line 58p is formed on the source region 54, which has a larger width than the source line, to be electrically connected with the source region and to cross over the active regions. Since the source region 54 is wider than the source line 58p, the spacers 60 can be formed on the sidewalls of the source line and still be disposed over an outer portion of the source region. The charge storage layer 62 is conformally formed on the active regions, to cover the source line 58p and the spacers 60 as well as substrate surface areas adjacent the spacers, that is, on a portion of the active region. The word lines 64 formed on the charge storage layer 62 cross over the active regions, traveling above the substrate surface in parallel with the source line 58p. The word lines 64 are formed to have a spacer-like configuration that is self-aligned with respect to the sidewalls of the spacers 60. Drain regions 66d are formed in the active regions adjacent the word lines 64 and spaced apart from the source regions 54.

That is, the word lines 64 are respectively disposed between the source regions 54 and the drain regions 66d and are formed above the active regions, interposing the charge storage layer 62. Thus, the word lines 64 are formed to be disposed on either side of the patterned insulating film 56r and at both sidewalls of the source line 58p, without being defined by photolithography, that is, by way of a self-alignment technique. Therefore, using the self-alignment technique, the word lines 64 of the present invention can be formed with a width smaller than the limit of a photolithographic process. While photolithography is used to form the source region 54 and the source line 58p, the word lines 64 are formed at both sides of the source line 58p using an anisotropic etch back process, thereby enabling a reduction in unit cell size or area.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a nonvolatile memory device, comprising:

forming a source region in an active region of a semiconductor substrate;

forming an insulating film having an opening that partially exposes the source region;

forming a conductive film on the insulating film, the conductive film being electrically connected with the source region through the opening;

patterning the conductive film to form a source line connected with the source region and crossing the active region;

forming spacers at sidewalls of the source line and on the insulating film;

removing a portion of the insulating film, while leaving another portion of the insulating film remaining below the spacers;

conformally forming a charge storage layer on the active region, the spacers, and the source line;

forming word lines on the charge storage layer on the active region, the word lines being formed to have a spacer-like configuration that is self-aligned with respect to the sidewalls of the spacers; and forming a drain region in the active region adjacent the word lines and spaced apart from the source region.

2. The method of claim 1, wherein
the source line having a width less than the source region.

3. The method of claim 1, wherein the source region has a width greater than the source line.

4. The method of claim 3, wherein the spacers are formed over a portion of the source region corresponding to the greater width.

5. The method of claim 1, wherein the spacers and the word lines are symmetrically formed at both sides of the source line.

* * * * *

UNITED STATES PATENT AND TRADEMARK OFFICE
CERTIFICATE OF CORRECTION

| | | |
|---|---|---|
| PATENT NO. | : 7,704,829 B2 | Page 1 of 1 |
| APPLICATION NO. | : 11/320906 | |
| DATED | : April 27, 2010 | |
| INVENTOR(S) | : Sang Bum Lee | |

It is certified that error appears in the above-identified patent and that said Letters Patent is hereby corrected as shown below:

Title Page;
On the cover, at the listing of the Assignee at INID code (73), change "LG Electronics Inc., Seoul (KR)" to --Dongbu Semiconductor Inc., Seoul (KR)--.

Signed and Sealed this
Twenty-second Day of February, 2011

David J. Kappos
*Director of the United States Patent and Trademark Office*